US006437600B1

(12) United States Patent
Keeth

(10) Patent No.: US 6,437,600 B1
(45) Date of Patent: *Aug. 20, 2002

(54) ADJUSTABLE OUTPUT DRIVER CIRCUIT

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/924,363

(22) Filed: Aug. 7, 2001

Related U.S. Application Data

(62) Division of application No. 09/316,744, filed on May 21, 1999, which is a continuation of application No. 08/743,614, filed on Nov. 4, 1996, now Pat. No. 5,917,758.

(51) Int. Cl.[7] .............................................. H03K 17/16
(52) U.S. Cl. .............................. 326/86; 326/30; 326/26; 326/27; 326/87; 327/170; 327/380; 327/381; 365/189.05; 365/189.11
(58) Field of Search .............................. 326/26, 27, 30, 326/83, 86, 87; 327/170, 380, 381; 365/189.07, 230.06, 225.7

(56) References Cited

U.S. PATENT DOCUMENTS

| | | | |
|---|---|---|---|
| 4,096,402 A | 6/1978 | Schroeder et al. | 307/362 |
| 4,404,474 A | 9/1983 | Dingwall | 307/260 |
| 4,638,187 A | 1/1987 | Boler et al. | 307/451 |
| 4,789,796 A | 12/1988 | Foss | 307/443 |
| 4,958,088 A | 9/1990 | Farah-Bakhsh et al. | 307/443 |
| 4,984,204 A | 1/1991 | Sato et al. | 365/189.11 |
| 5,122,690 A | 6/1992 | Bianchi | 307/475 |
| 5,128,560 A | 7/1992 | Chern et al. | 307/475 |
| 5,128,563 A | 7/1992 | Hush et al. | 307/482 |
| 5,134,311 A | 7/1992 | Biber et al. | 307/270 |
| 5,150,186 A | 9/1992 | Pinney et al. | 357/42 |

(List continued on next page.)

FOREIGN PATENT DOCUMENTS

| | | |
|---|---|---|
| EP | 0 450 871 A2 | 10/1991 |
| EP | 0 655 741 A2 | 5/1993 |
| EP | 0 680 049 A2 | 11/1995 |
| JP | 2-112317 | 4/1990 |
| JP | 4-135311 | 8/1992 |
| JP | 5-136664 | 1/1993 |
| JP | 5-282868 | 10/1993 |
| WO | 96/10866 | 4/1996 |

OTHER PUBLICATIONS

Chapman, et al., "A Low–Cost High–Performance CMOS Timing Vernier for ATE", *IEEE International Test Conference*, 459–468, (1995).

Descriptive literature entitled, "400MHz SLDRAM, 4M×16 SLDRAM Pipelined, Eight Bank, 2.5 V Operation," SLDRAM Consortium Advance Sheet, published throughout the United Stated, pp. 1–22.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

(List continued on next page.)

*Primary Examiner*—Michael Tokar
*Assistant Examiner*—Vibol Tan
(74) *Attorney, Agent, or Firm*—Dorsey & Whitney LLP

(57) ABSTRACT

An adjustable integrated circuit output driver circuit is described which has a push-pull output circuit comprised of a pullup and pulldown transistor. A series of parallel transistors are connected to both the pullup and pulldown transistors. The gates of the parallel transistors are selectively controlled to adjust the driver current connected to a data bus line. Adjustable slew rate control circuits are describe which are coupled ot the pullup and pulldown transistors. Slew rate control circuitry and output control circuitry is provided to selectively adjust the driver circuit either during manufacture or after installation on a data bus. An alternate open-drain adjustable output driver circuit is also described.

5 Claims, 10 Drawing Sheets

U.S. PATENT DOCUMENTS

| | | | |
|---|---|---|---|
| 5,165,046 A | 11/1992 | Hesson | 307/270 |
| 5,179,298 A | 1/1993 | Hirano et al. | 307/443 |
| 5,194,765 A | 3/1993 | Dunlop et al. | 307/443 |
| 5,220,208 A | 6/1993 | Schenck | 307/443 |
| 5,239,206 A | 8/1993 | Yanai | 307/272.2 |
| 5,243,703 A | 9/1993 | Farmwald et al. | 395/325 |
| 5,254,883 A | 10/1993 | Horowitz et al. | 307/443 |
| 5,274,276 A | 12/1993 | Casper et al. | 307/443 |
| 5,276,642 A | 1/1994 | Lee | 365/189.04 |
| 5,278,460 A | 1/1994 | Casper | 307/296.5 |
| 5,281,865 A | 1/1994 | Yamashita et al. | 307/279 |
| 5,311,481 A | 5/1994 | Casper et al. | 365/230.06 |
| 5,321,368 A | 6/1994 | Hoelzle | 328/63 |
| 5,347,177 A | 9/1994 | Lipp | 307/443 |
| 5,347,179 A | 9/1994 | Casper et al. | 307/451 |
| 5,355,391 A | 10/1994 | Horowitz et al. | 375/36 |
| 5,361,002 A | 11/1994 | Casper | 327/530 |
| 5,381,364 A | 1/1995 | Chern et al. | 365/145 |
| 5,400,283 A | 3/1995 | Raad | 365/203 |
| 5,426,610 A | 6/1995 | Childers et al. | 365/205 |
| 5,432,823 A | 7/1995 | Gasbarro et al. | 375/356 |
| 5,438,545 A | 8/1995 | Sim | 365/189.05 |
| 5,440,260 A | 8/1995 | Hayashi et al. | 327/278 |
| 5,444,662 A | 8/1995 | Tanaka et al. | 365/203 |
| 5,451,898 A | 9/1995 | Johnson | 327/53 |
| 5,457,407 A | 10/1995 | Shu et al. | 326/30 |
| 5,473,575 A | 12/1995 | Farmwald et al. | 365/230.06 |
| 5,485,490 A | 1/1996 | Leung et al. | 375/371 |
| 5,488,321 A | 1/1996 | Johnson | 327/66 |
| 5,497,127 A | 3/1996 | Sauer | 331/17 |
| 5,498,990 A | 3/1996 | Leung et al. | 327/323 |
| 5,506,814 A | 4/1996 | Hush et al. | 365/230.03 |
| 5,508,638 A | 4/1996 | Cowles et al. | 326/38 |
| 5,513,327 A | 4/1996 | Farmwald et al. | 395/309 |
| 5,568,077 A | 10/1996 | Sato et al. | 327/199 |
| 5,574,698 A | 11/1996 | Raad | 365/230.06 |
| 5,576,645 A | 11/1996 | Farwell | 327/94 |
| 5,578,941 A | 11/1996 | Sher et al. | 326/34 |
| 5,581,197 A | * 12/1996 | Motley et al. | 326/30 |
| 5,583,457 A | 12/1996 | Horiguchi et al. | 326/121 |
| 5,585,740 A | * 12/1996 | Tipon | 326/26 |
| 5,589,788 A | 12/1996 | Goto | 327/276 |
| 5,590,073 A | 12/1996 | Arakawa et al. | 365/185.08 |
| 5,598,107 A | * 1/1997 | Cabuk | 326/27 |
| 5,615,161 A | 3/1997 | Mu | 365/208 |
| 5,619,473 A | 4/1997 | Hotta | 365/238.5 |
| 5,621,340 A | 4/1997 | Lee et al. | 327/65 |
| 5,621,690 A | 4/1997 | Jungroth et al. | 365/200 |
| 5,627,780 A | 5/1997 | Malhi | 365/185.09 |
| 5,627,791 A | 5/1997 | Wright et al. | 365/222 |
| 5,631,872 A | 5/1997 | Naritake et al. | 365/227 |
| 5,636,163 A | 6/1997 | Furutani et al. | 365/189.01 |
| 5,636,173 A | 6/1997 | Schaefer | 365/230.03 |
| 5,636,174 A | 6/1997 | Rao | 365/230.03 |
| 5,638,318 A | 6/1997 | Seyyedy | 365/145 |
| 5,638,335 A | 6/1997 | Akiyama et al. | 365/230.03 |
| 5,650,971 A | 7/1997 | Longway et al. | 365/207 |
| 5,668,763 A | 9/1997 | Fujioka et al. | 365/200 |
| 5,684,749 A | 11/1997 | Seyyedy et al. | 365/203 |
| 5,694,065 A | 12/1997 | Hamasaki et al. | 327/108 |
| 5,760,620 A | 6/1998 | Doluca | 327/112 |

OTHER PUBLICATIONS

Ljuslin, et al., "An Integrated 16–Channel CMOS Time to Digital Converter", *Nuclear Science Symposium & Medical Imaging Conference* Vol. 1, IEEE Conference Record, 625–629, (1993).

Taguchi, M. et al., "A 40–ns 64–Mb DRAM with 64–b Parallel Data Bus Architecture," IEEE J. Solid–State Circuit, 26, 1493–1497, Nov. 1991.

* cited by examiner

ADJUSTABLE OUTPUT DRIVER CIRCUIT

CROSS-REFERENCE TO RELATED APPLICATIONS

This application is a divisional of pending U.S. patent application Ser. No. 09/316,744, filed May 21, 1999, which is a continuation of U.S. patent application Ser. No. 08/743,614, filed Nov. 4, 1996 which issued on Jun. 29, 1999 as U.S. Pat. No. 5,917,758.

TECHNICAL FIELD OF THE INVENTION

The present invention relates generally to integrated circuits and in particular the present invention relates to data output drivers for high speed data transmissions.

BACKGROUND OF THE INVENTION

Integrated circuits typically include a number of input/output pins which are used for communication with additional circuitry. For example, an integrated memory device such as a dynamic random access memory (DRAM) includes both control inputs for receiving memory operation control signals, and data pins for bi-directional data communication with an external system or processor.

The data transmission rate of modem integrated circuits is primarily limited by internal circuitry operating speeds. That is, communication networks have been developed which can transmit signals between circuitry at a rate that is faster than the capacity of many integrated circuits. To address the need for faster circuits, a group of integrated circuits can be combined on a common bus. In this configuration, each integrated circuit operates in a coordinated manner with the other integrated circuits to share data which is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory is processing received data, another memory is receiving new data. By providing an appropriate number of memory devices and an efficient control system, very high speed data transmissions can be achieved.

As the transmission rate of the data communication signals continues to increase, new circuitry and methods are needed to accurately transmit data from each integrated circuit. One proposed solution is a bus driver described in U.S. Pat. No. 5,254,883. This bus driver circuit uses parallel open-drain output transistors. The output transistors are fabricated in different sizes and selectively activated to control the bus current. This technique requires a relatively large number of output transistors to implement.

For the reasons stated above, and for other reasons stated below which will become apparent to those skilled in the art upon reading and understanding the present specification, there is a need in the art for a high speed output driver circuit which is fully adjustable, and requires a limited number of output transistors.

SUMMARY OF THE INVENTION

The above mentioned problems with integrated circuit data transmission and other problems are addressed by the present invention and which will be understood by reading and studying the following specification. An adjustable output driver circuit is described which includes an adjustable push-pull output, and an adjustable slew rate control.

In particular, the present invention describes an integrated circuit output driver circuit comprising a push-pull output comprising a pullup output transistor having a drain connected to a data communication line, and a pulldown output transistor having a drain connected to the data communication line. The integrated circuit output driver circuit further comprises a first adjustable circuit connected to a source of the pullup output transistor for adjusting a resistance between the drain of the pullup output transistor and a first reference voltage, and a second adjustable circuit connected to a source of the pulldown output transistor for adjusting a resistance between the source of the pulldown output transistor and a second reference voltage.

In an alternate embodiment, a synchronous memory device is described. The memory comprises an array of memory cells for storing data received on a data communication line, and an output driver circuit for outputting data read from the array of memory cells. The output driver circuit comprises a push-pull output comprising a pullup output transistor having a drain connected to the data communication line, and a pulldown output transistor having a drain connected to the data communication line. The output driver circuit further comprises a first adjustable circuit connected to a source of the pullup output transistor for adjusting a resistance between the source of the pullup output transistor and a first reference voltage, and a second adjustable circuit connected to a source of the pulldown output transistor for adjusting a resistance between the source of the pulldown output transistor and a second reference voltage. The first adjustable circuit comprises a first plurality of transistors connected in parallel and each having a drain connected to the source of the pullup transistor and the first reference voltage. The second adjustable circuit comprises a second plurality of transistors connected in parallel and each having a drain connected to the source of the pulldown transistor and the second reference voltage.

In yet another embodiment, an integrated circuit output driver circuit is described which comprises an output transistor having a drain connected to a data communication line, and an adjustable circuit connected to a source of the output transistor for adjusting a resistance between the source of the output transistor and a first reference voltage.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
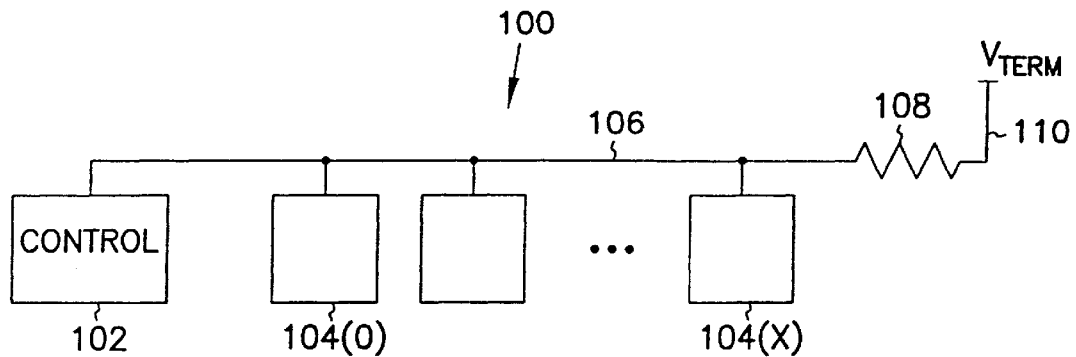
FIG. 1 is a diagram of a memory bus.

FIG. 1 is a simplified illustration of a memory bus 100 which includes a control circuit 102 to provide control and data signals to a number of integrated circuits 104(0)–104(x) via a plurality of communication lines 106. The communication lines are terminated with an appropriate termination circuit 108 (generally illustrated as a resistor) coupled to a termination voltage (Vterm).

Figure 2:
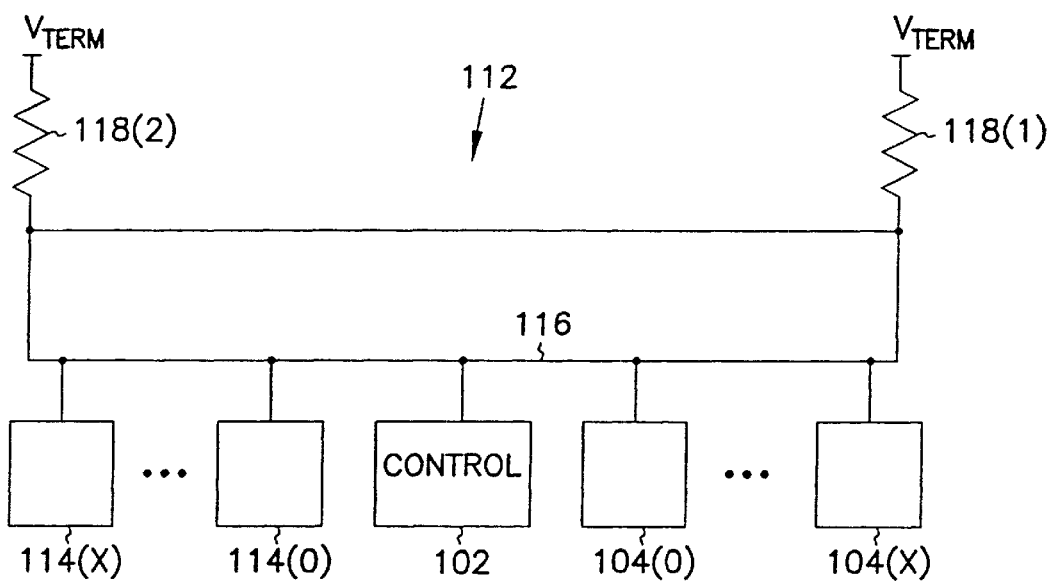
FIG. 2 is a diagram of an alternate memory bus.

FIG. 2 is a simplified illustration of a memory bus 112 which includes a centrally located control circuit 102 to provide control and data signals to a number of integrated circuits 104(0)–104(x), and 114(0)–114(x) via a plurality of communication lines 116. The communication lines are terminated at both ends with an appropriate termination circuit 118(1) and 118(2) (generally illustrated as a resistor) coupled to a termination voltage (Vterm). The preferred value of Vterm is ½(Vdd-Vss), but can be any mid-supply level.

Figure 3:
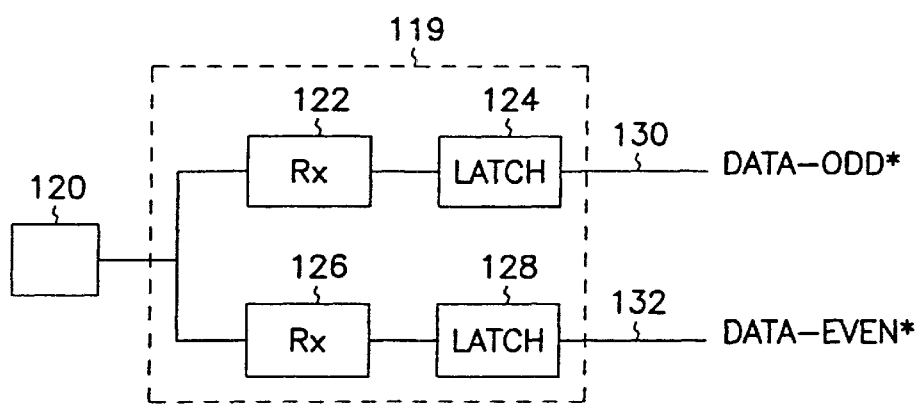
FIG. 3 is a block diagram of a dual receiver input buffer circuit.

FIG. 3 is a block diagram of an input buffer 119 connected to a data input 120. The buffer includes two receiver circuits 122 and 126 connected in parallel and two latch circuits 124 and 128. Each latch circuit produces a data output on either node 130 (Data-odd*) or node 132 (Data-even*). The receivers operate off different phases of a common data clock signal provided on a bus line. The receivers, therefore, are not edge triggered, but are controlled using internal vernier delays. The vernier delays are adjusted at system startup to maximize valid data receipt. That is, the delays are adjusted so that data sampling is conducted when valid data is present and not limited to an edge transition of a clock signal. The dual receiver input buffer illustrated can be used for high speed data communication in the range of 800+ mega bits per second. For slower data communication rates, such as 400 mega bits per second, a single receiver and latch circuit can be used in the input buffer.

Figure 4:
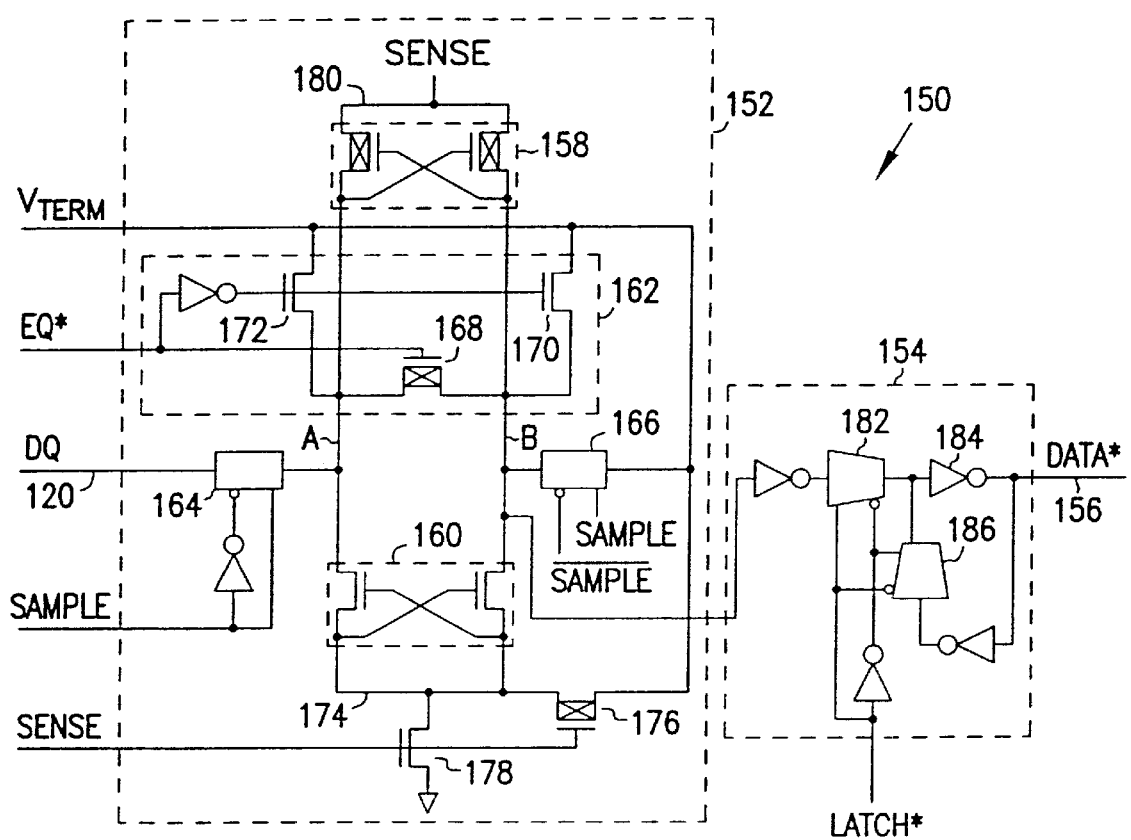
FIG. 4 is a schematic diagram of a single receiver high speed input buffer.

Referring to FIG. 4, a high speed input buffer 150 is described which uses a receiver 152 and a latch circuit 154 to produce an internal data signal (Data) on output 156. The receiver 152 circuit operates in response to internal signals which are based upon different phases of a common clock signal provided on a bus coupled to other integrated circuits. The internal signals are an equilibrate signal (EQ*), a sense signal (Sense), and a sample signal (Sample). The receiver is connected to the bus termination voltage (Vterm) and is connected to the bus data line through data input connection 120.

The receiver 152 is comprised of a p-type sense amplifier circuit 158 having a pair of cross coupled p-type transistors, and an n-type sense amplifier 160 having a pair of cross coupled n-type transistors. An equilibrate circuit 162 is provided to equilibrate the common nodes of the sense amplifiers (nodes A and B) to Vterm. Coupling circuitry 164 and 166 is provided to selectively couple node 120 and Vterm to nodes A and B, respectively, in response to the Sample signal. To better understand the operation of the input buffer, reference is made to the timing diagram of FIG. 5.

Figure 5:
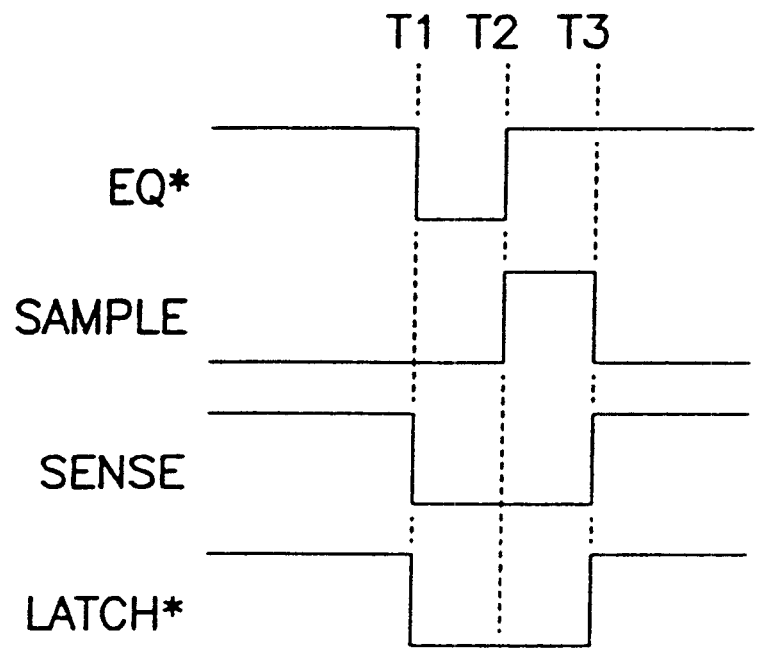
FIG. 5 is a timing diagram of the operation of the input buffer of FIG. 4.

As illustrated in FIG. 5, the equilibrate signal (EQ*) transitions low at time t1 to activate transistors 168, 170 and 172 of the equilibrate circuit 162. Transistors 170 and 172 couple nodes B and A, respectively, to the termination voltage, Vterm. The sense amplifiers, therefore, are equilibrated to the bus termination voltage. At time t2, the equilibration circuitry is deactivated, and the Sample signal transitions high and activates coupling circuit 164 to couple input 120 to node A. Couple circuit 166, likewise, is activated to couple node B to the termination voltage, Vterm. With the Sense signal low at time t2, node 180 of the p-sense amplifier circuit 158 is coupled low, and node 174 of the n-sense amplifier is coupled to Vterm through transistor 176. At time t3, the Sense signal transitions high to activate transistor 178 and couple node 174 to ground. The Sample signal transitions low to isolate nodes A and B such that p-sense amplifier and n-sense amplifier amplify nodes A and B to an appropriate voltage level. The Latch* signal transitions high at time t3 to activate latch circuit 154. Thus, coupling circuit 182 is activated to couple the inverse of node B to inverter circuit 184. When the Latch* signal returns to a low state, circuit 182 is deactivated and circuit 186 is activated to latch inverter 184. Although the latch is connected to node B, latch circuit 154 can be coupled to node A and is not intended to limited the present invention. It will be understood by those skilled in the art that the signals illustrated in FIG. 5 are internally generated in response to an externally received clock signal. Thus, the input data buffer is operated off different phases of the clock signal.

Figure 6:
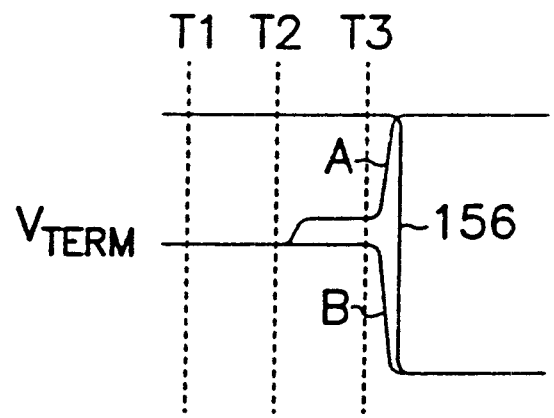
FIG. 6 is a timing diagram of select voltages of the input buffer of FIG. 4.

FIG. 6 illustrates the voltages on nodes A and B and the output node 156 upon receipt of a high input data signal. At time t1 Nodes A and B are equilibrated to Vterm. At time t2, node A is coupled to input 120 and increases in voltage. At time t3, the sense amplifier circuitry is activated and nodes A and B are amplified. At the same time, node B is coupled to the latch circuit and the output data signal on 156 is coupled to node B.

Figure 7:
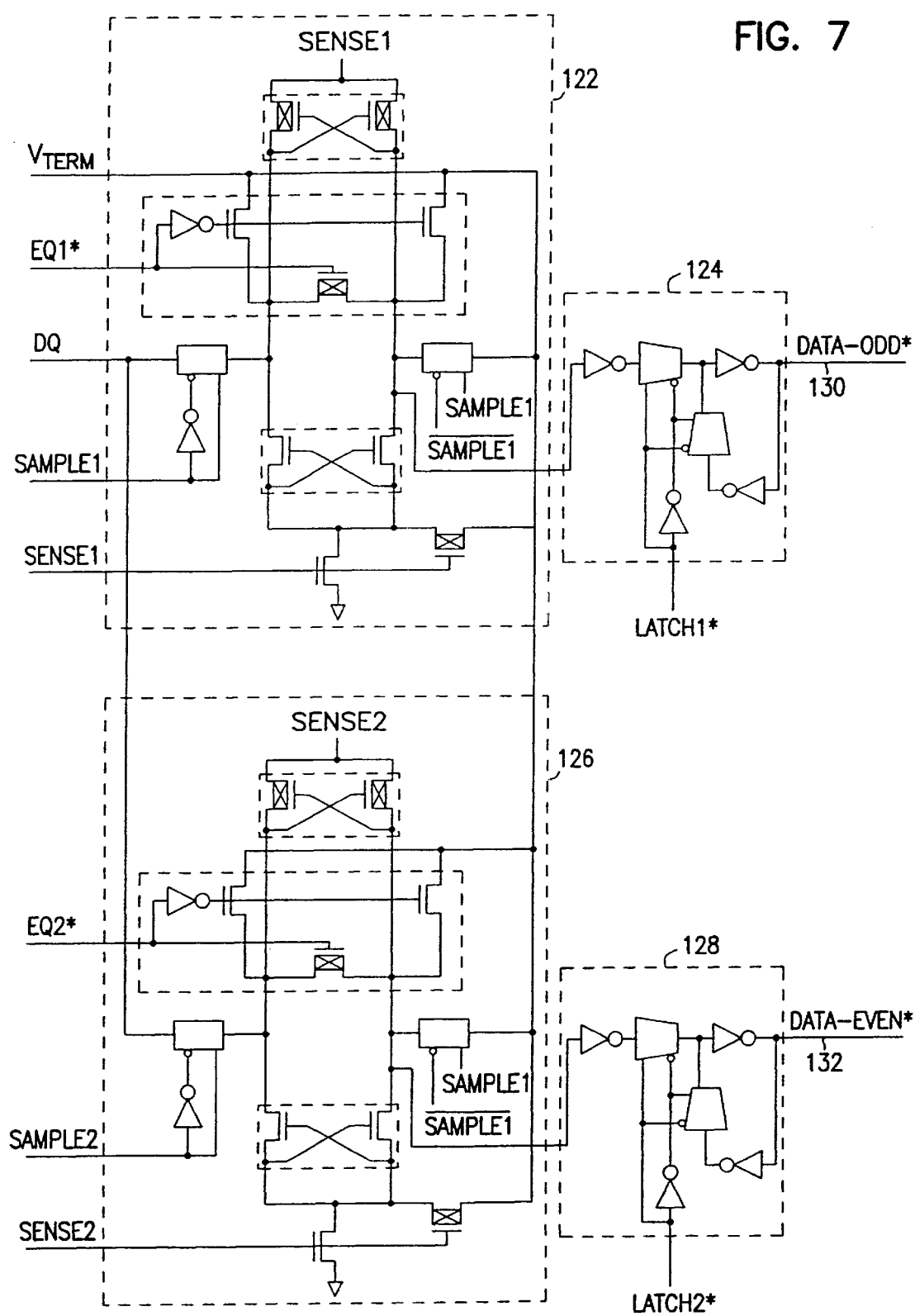
FIG. 7 is a schematic diagram of an alternate high speed input buffer.
Figure 8A:
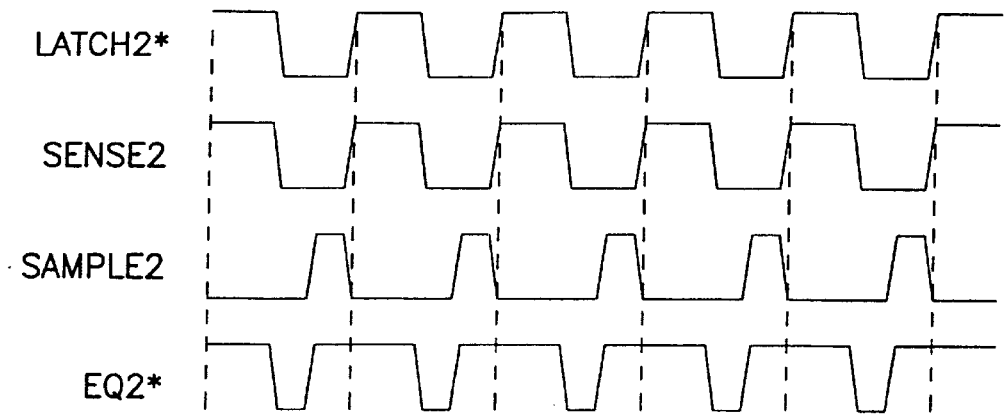
FIGS. 8A, B and C is a timing diagram of the operation of the input buffer of FIG. 7.
Figure 8B:
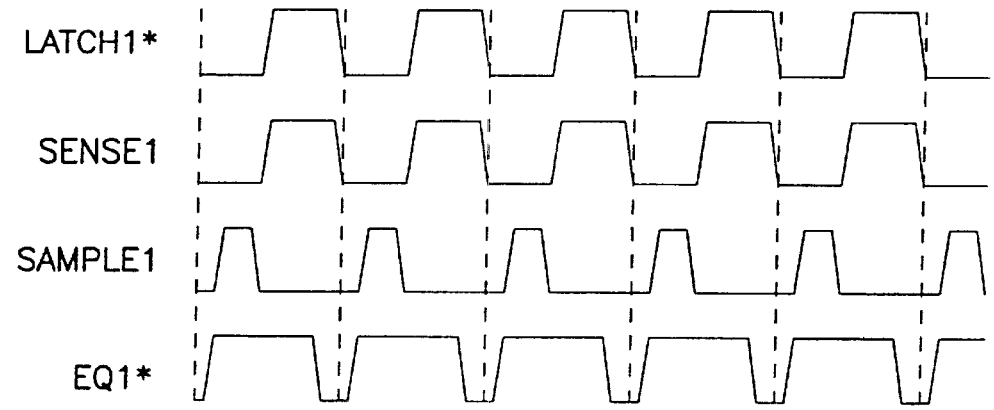
Figure 8C:
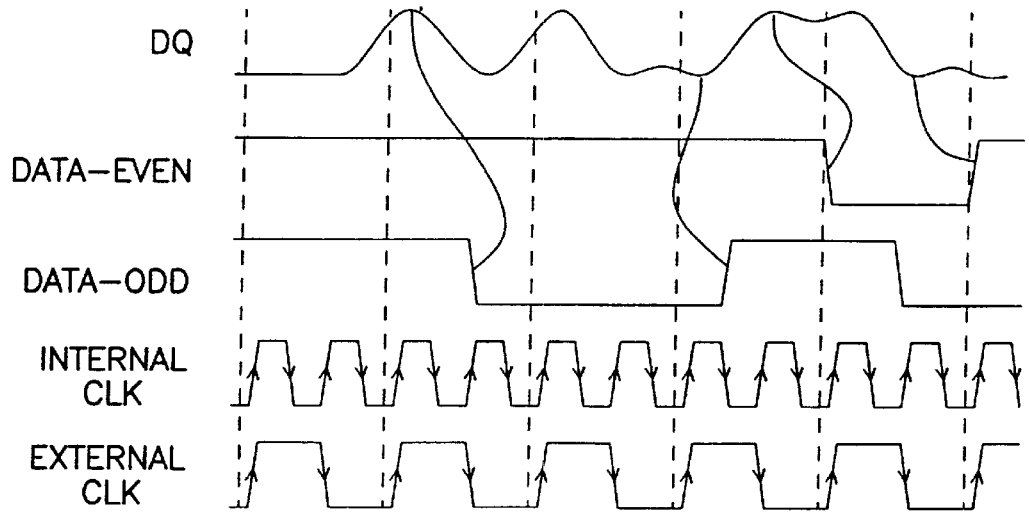

FIG. 7 is a schematic diagram of a high speed input buffer having two parallel receivers 122 and 126, and two latch circuits 124 and 128, as illustrated in FIG. 3. The receivers 122 and 126 generally include the circuitry of receiver 152 and operate in a similar manner, as described above with reference to FIG. 4. The timing diagram of FIGS. 8A, 8B and 8C illustrate the operation of the high speed input buffer of FIG. 7. The data signal provide on the DQ line is sampled by both receivers 122 and 126 on the rising edge of their respective sample signals. The DQ line, therefore, is sampled by both receiver circuits. The outputs (Data-even* and Data-odd*) together represent the data provided on the DQ line. The external bus clock signal and an internal clock signal operating at twice the frequency of the external clock are illustrated. The equilibrate signals (EQ1* and EQ2*) are substantially aligned with the clock signals. As such the external clock signal can be defined logically as being equal to ½(EQ1* AND EQ2*). The sample signals are timed using the vernier delay circuit to sample the DQ line when the data signals are at a signal peak.

Figure 9A:
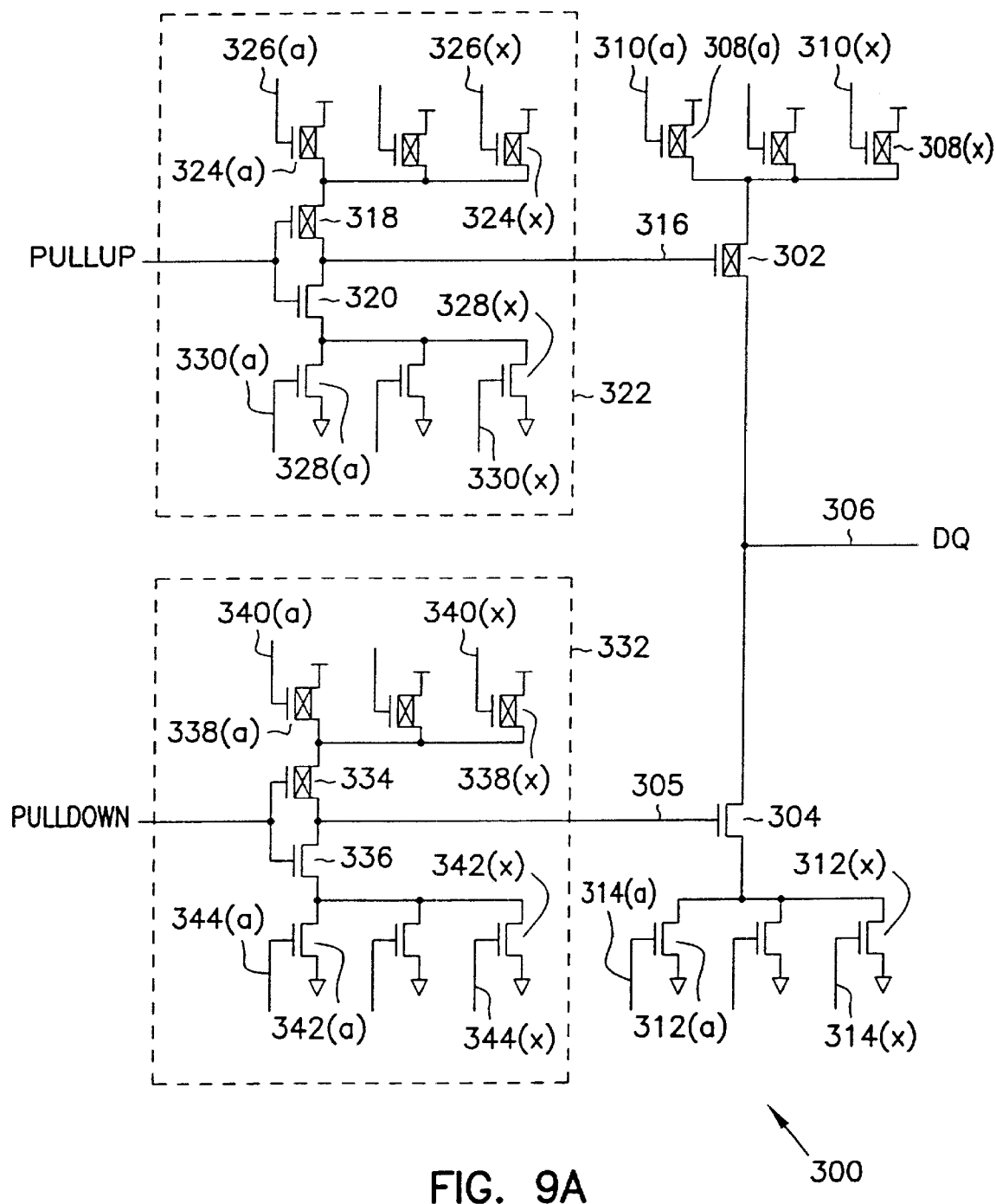
FIG. 9A is a schematic diagram of an adjustable output driver circuit.

FIG. 9A is a schematic diagram of an output driver circuit 300. The output driver circuit includes a pullup output transistor 302 and a pulldown output transistor 304 connected to DQ output line 306 and configured as a push-pull output. A series of transistors 308(a)–308(x) are connected to the source of output transistor 302. The transistors 308 are fabricated so that the activated drain to source resistance of each transistor is different from the other. Preferably, the transistors are fabricated in a binary relationship such that transistor 308(b) has twice the resistance of 308(a) and 308(x) has twice the resistance of 308(b). It will be appreciated that other relationships can be used in alternate embodiments to achieve the adjustable features of the output driver, as described below. The transistors 308(a)–(x) are selectively activated by signals provided on gates 310(a)–(x) so that the resistance connected between the source of transistor 302 and a reference voltage is adjustable.

A series of transistors 312(a)–312(x) are connected in parallel to the source of output transistor 304 and selectively activated by signals provided on gates 314(a)–314(x) so that the resistance connected between the source of transistor 304 and a reference voltage is adjustable. Preferably, transistors 312 are fabricated in the same binary manner as transistors 308. That is, transistors 312 are designed to mirror transistors 308.

A slew rate control circuit 322 is connected to gate 316 of the output pullup transistor 302. The slew rate control circuit 322 includes a push-pull circuit comprised of transistors 318 and 320. The gates of transistors 318 and 320 are connected to receive a pullup signal. A series of transistors 324(a)–324(x) are connected in parallel between the source of transistor 318 and a reference voltage. The transistors 324 are fabricated so that the activated drain to source resistance of each transistor is different from the other. Preferably, the transistors are fabricated in a binary relationship such that transistor 324(b) has twice the resistance of 324(a) and 324(x) has twice the resistance of 324(b). It will be appreciated that other relationships can be used in alternate embodiments to achieve the adjustable features of the slew rate control, as described below. The transistors 324(a)–(x) are selectively activated by signals provided on gates 326(a)–(x) so that the resistance connected to the source of transistor 318 is adjustable.

A series of transistors 328(a)–(x) are connected in parallel between the source of transistor 320 and a reference voltage. The transistors 328 are fabricated so that the activated drain to source resistance of each transistor is different from the other. Preferably, the transistors are fabricated in the same binary manner as transistors 324. It will be appreciated that other relationships can be used in alternate embodiments to achieve the adjustable features of the slew rate control circuit, as described below.

A slew rate control circuit 332 is connected to gate 305 of the output pulldown transistor 304. The slew rate control circuit 332 includes a push-pull circuit comprised of transistors 334 and 336. The gates of transistors 334 and 336 are connected to receive a pulldown signal. A series of transistors 338(a)–(x) are connected in parallel between the source of transistor 334 and a reference voltage. The transistors 338 are fabricated so that the activated drain to source resistance of each transistor is different from the other, as described above with reference to transistors 324. Transistors 338(a)–(x) are selectively activated by gates 340(a)–(x) so that the resistance connected to the source of transistor 334 is adjustable.

A series of transistors 342(a)–(x) are connected to the source of transistor 336. The transistors 342 are fabricated so that the activated drain to source resistance of each transistor is different from the other. Preferably, the transistors are fabricated in the same binary manner as transistors 338. In a preferred embodiment, gate signals on gates 344(a)–(x) and the inverse of gates 340(a)–(x), and the gate signals on gates 330(a)–(x) and the inverse of gates 326(a)–(x).

Figure 9B:
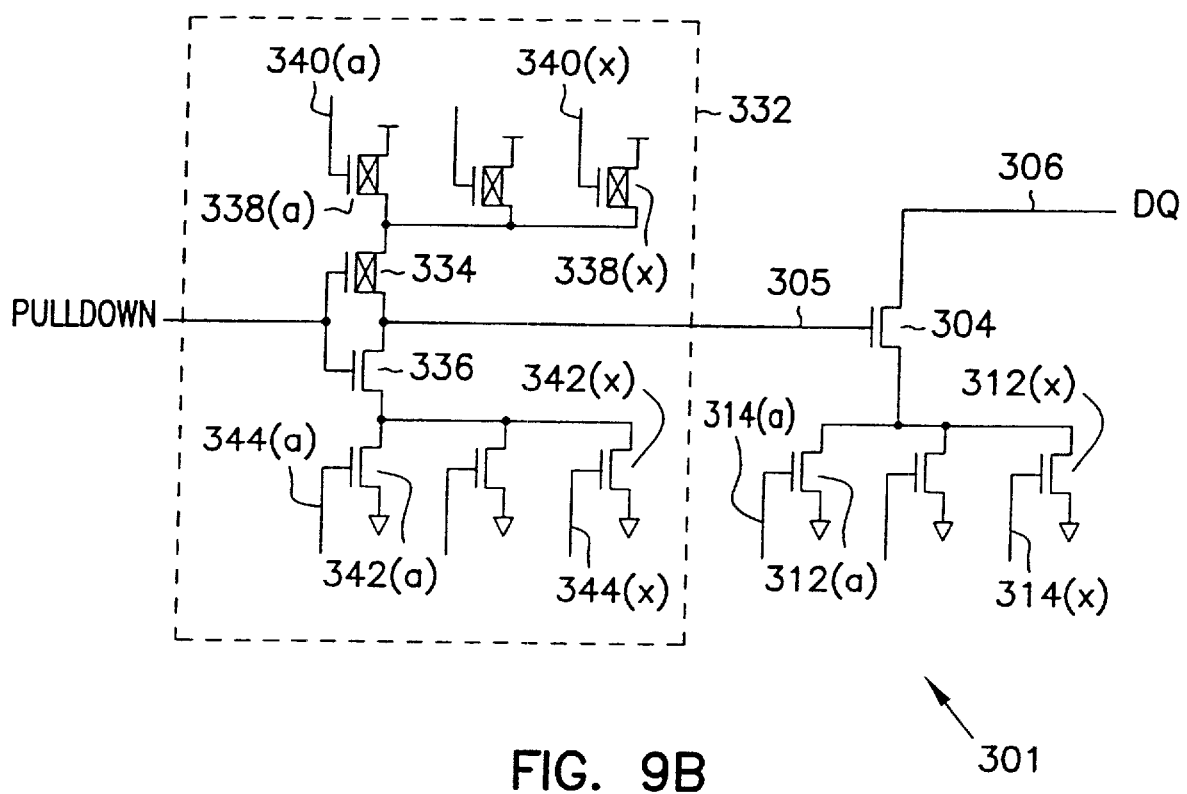
FIG. 9B is a schematic diagram of an alternate adjustable output driver circuit.

FIG. 9B is a schematic diagram of an adjustable open-drain output driver circuit including half of the driver circuit of FIG. 9A. The driver circuit includes a pulldown transistor 304 which has a drain connected to the DQ output 306. The source of output transistor 304 is connected to a series of transistors 312(a)–(x), as described above for adjusting a source resistance. A slew rate control circuit 332 is connected to the gate of transistor 304 for controlling the activation of transistor 304 to reduce noise experienced on the DQ line. The slew rate control circuit includes a first series of parallel connected transistors 338(a)–(x) and a second series of parallel connected transistors 342(a)–(x), as described above for controlling the pullup and pulldown resistances of the slew rate control circuit. This embodiment of the output driver circuit is particularly applicable to a bus adapted to receive open drain output devices.

Figure 10B:
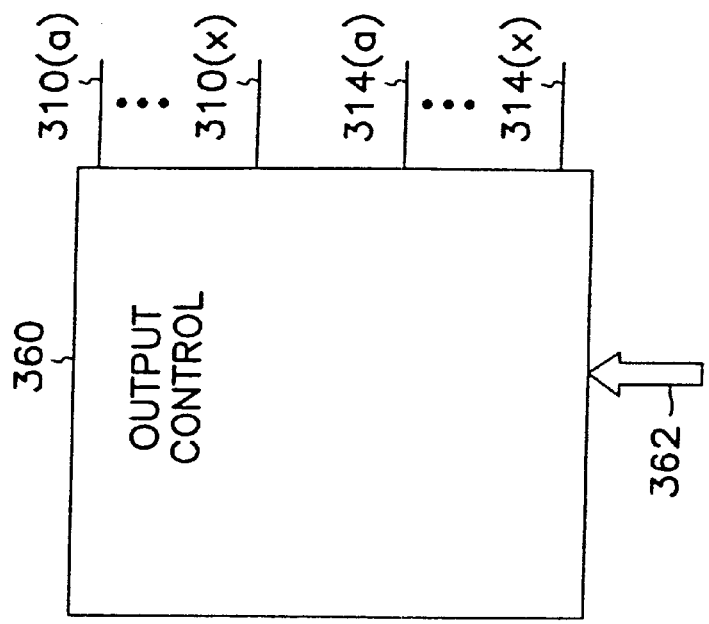
FIG. 10B is a block diagram of an output control circuit.
Figure 10A:
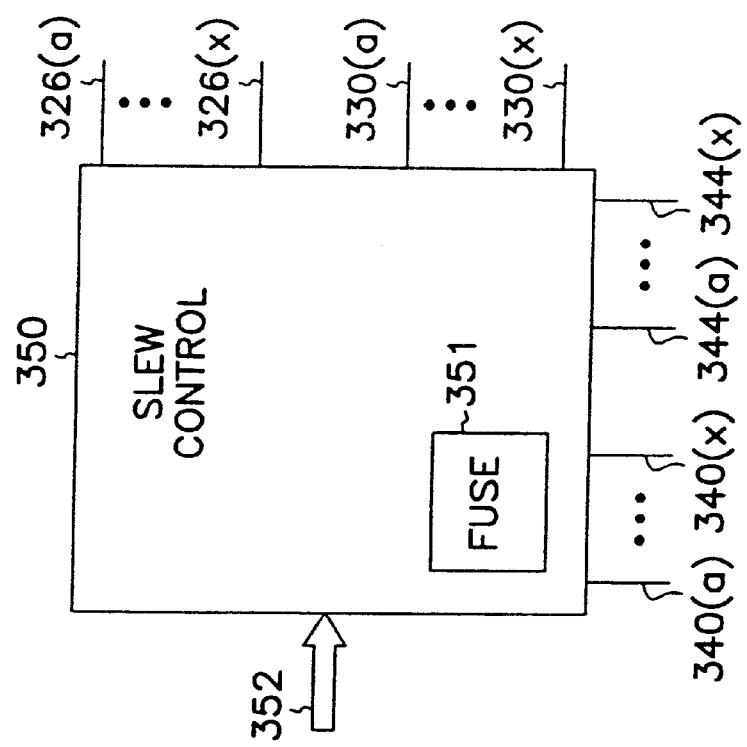
FIG. 10A is a block diagram of a slew rate control circuit.

FIG. 10A is a block diagram of a slew rate generator circuit 350 which controls the gate signals on gates 326, 330, 340, and 344 of the slew rate circuits 322 and 332. The generator circuit 350 preferably includes fuse circuitry 351 to selectively activate the gate signals. That is, the fuse circuits are programmed during the manufacture of the integrated circuit, so that the output transistors 302 and 304 are turned on and off to reduce noise and ringing experienced on the DQ line 306 by transistors 302 and 304. Although the slew generator circuit 350 includes fuse circuits in a preferred embodiment, the circuit could receive optional feedback signals 352 to allow for custom control of the slew rate circuits 322 and 332 after the integrated circuit is installed on a specific bus. In either embodiment, the slew rate circuits have a controlled push-pull circuit in which the pullup and pulldown resistance is adjustable using parallel transistors.

FIG. 10B is a block diagram of an output control circuit 360 for selectively activating a signal on gates 310(a)–(x) and/or 314(a)–(x). The control circuit 360 in a preferred embodiment receives external signals on lines 362 to control transistors 308 and 312 to adjust the pullup and pulldown resistance between output transistors 302 and 304 and reference voltages. The control signals received on lines 362 are generated using an external comparator circuit (not shown) to measure the signal provided on the DQ bus line and adjust the driver circuit accordingly. The comparator, therefore, compares the bus signal with a known bus voltage and generates a control signal used to adjust transistors 308 and 312. Thus, the push-pull output circuit is adjusted after the integrated circuit is installed on a data bus. The output driver circuit can be fabricated to default to have a specific output provided on lines 310 and 314. Thus, the output circuit 302/304 can be initially adjusted to an output current which is approximated to be the required value.

Figure 11:
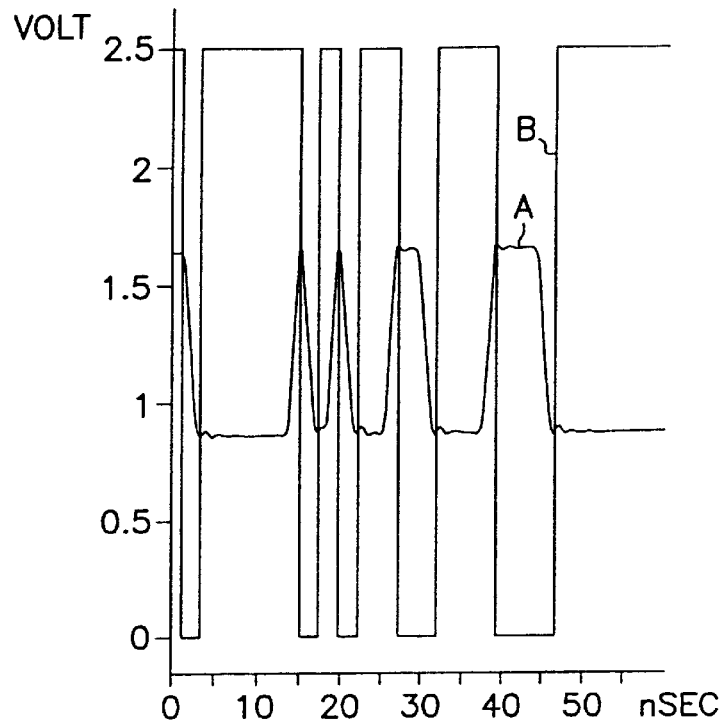
FIG. 11 is a diagram of the output of the driver circuit of FIG. 9.

FIG. 11 is a diagram of the output signal from the output driver circuit 300 of FIG. 9A. The circuit is fabricated with three slew transistors (a)–(c) for each transistors series 324, 328, 338, and 342. Likewise, three transistors 308(a)–(c) and three transistors 312(a)–(c) are connected to the output transistors. The signals on transistor gates 310(a)–(c) are 0,0,0, respectively. The signals on transistor gates 314(a)14(c) are 1,1,1, respectively. The signals on transistor gates 326(a)–(c) are 1,0,1 and the signals on transistor gates 330(a)–(c) are 0,1,0. Finally, the signals on transistor gates 332(a)–(c) are 0,1,1 and the signals on transistor gates 3440(a)–(c) are 1,0,0. The signal labeled A is the data bus signal provided by the output driver on data bus 306 as received at a far end of the data bus. That is, the signal is illustrated as it would appear to a device located a remote end of the bus. Signal B illustrates an output generated by the receiving device (not shown) in response to signal A.

Figure 12:
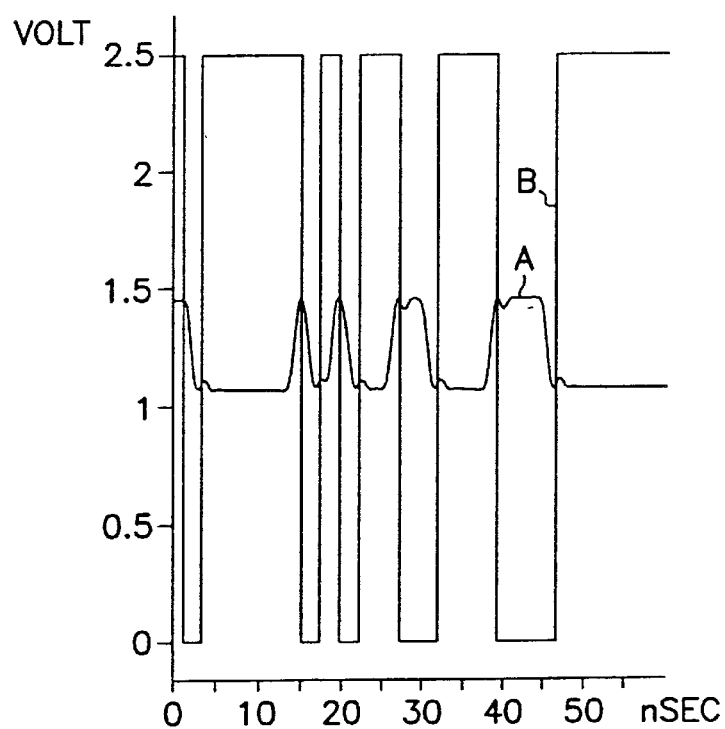
FIG. 12 is an alternate diagram of the output of the driver circuit of FIG. 9.

FIG. 12 is an alternate diagram of the output signal from the output driver circuit 300 of FIG. 9A with different output transistor resistances. The circuit is fabricated with three slew transistors (a)–(c) for each transistors series 324, 328, 338, and 342. Likewise, three transistors 308(a)–(c) and three transistors 312(a)–(c) are connected to the output transistors. The signals on transistor gates 310(a)–(c) are 0,1,1, respectively. The signals on transistor gates 314(a)–(c) are 1,0,0, respectively. The signals on transistor gates 326(a)–(c) are 1,0,1 and the signals on transistor gates 330(a)–(c) are 0,1,0. Finally, the signals on transistor gates 332(a)–(c) are 0,1,1 and the signals on transistor gates 3440(a)–(c) are 1,0,0. Like the diagram of FIG. 10A, the signal labeled A is the data bus signal provided by the output driver on data bus 306 as received at a far end of the data bus, and signal B illustrates an output generated by the receiving device (not shown) in response to signal A. Because the pullup and pulldown resistances of the output driver are different, signal A of FIG. 10B has a smaller voltage swing that signal A of FIG. 10A.

Figure 13:
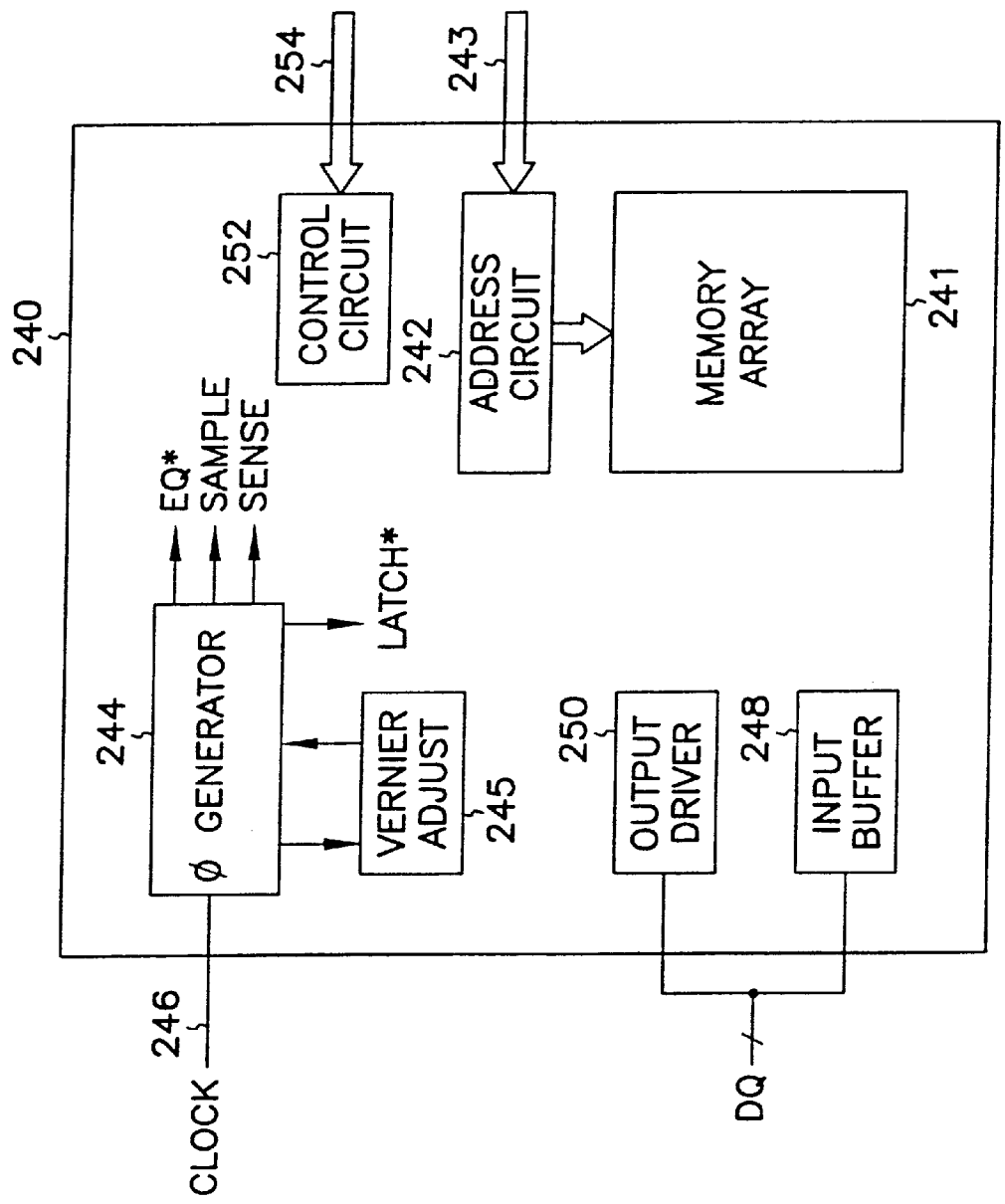
FIG. 13 is a block diagram of a memory device incorporating an adjustable output driver.

FIG. 13 is a block diagram of a dynamic random access memory device 240 (DRAM) incorporating a high speed output driver 300, as described above. The memory includes address circuitry 242 for accessing a memory array 241 in response to address signals provided on input lines 243. Control circuitry 252 is provided for controlling the read and write operations of the memory in response to control signals 254. A phase generator circuit 244 is provided to generate internal signals DQ*, Sample, Sense, and Latch* for the input buffer circuit. Vernier adjust circuit 245 is coupled to the phase generator for adjusting the timing of the internal signals. It will be understood that the input buffer circuit 248 includes a high speed input buffer circuit as described above for each data line, DQ. Likewise, the output driver circuitry 250 includes a driver circuit 300 or 301 as described above with reference to FIGS. 9A or 9B for each DQ line to drive an appropriate output signal on the DQ lines. Although the illustrative example of FIG. 13 is a DRAM, the high speed input buffer circuitry of the present invention can be included in any integrated circuit device, such as SRAM and ROM memory devices.

Conclusion

An adjustable integrated circuit output driver circuit is described which has a push-pull output circuit comprised of a pullup and pulldown transistor. A series of transistors are connected in parallel to both the pullup and pulldown transistors. The gates of the parallel transistors are selectively controlled to adjust the driver current connected to a data bus line. Adjustable slew rate control circuits are describe which are coupled to the pullup and pulldown transistors. Slew rate control circuitry and output control circuitry is provided to selectively adjust the driver circuit either during manufacture or after installation on a data bus.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A synchronous memory device comprising:
   an array of memory cells for storing data received on a data communication line;
   an output driver circuit for outputting data read from the array of memory cells, the output driver circuit comprising:
     a push-pull output circuit comprising a pullup output transistor having a drain connected to the data communication line, and a pulldown output transistor having a drain connected to the data communication line;
     a first adjustable circuit connected to a source of the pullup output transistor for adjusting a resistance between the source of the pullup output transistor and a first reference voltage, the first adjustable circuit comprises a first plurality of transistors connected in parallel and each having a drain connected to the source of the pullup transistor and the first reference voltage; and
     a second adjustable circuit connected to a source of the pulldown output transistor for adjusting a resistance between the source of the pulldown output transistor and a second reference voltage, the second adjustable circuit comprises a second plurality of transistors connected in parallel and each having a drain connected to the source of the pulldown transistor and the second reference voltage.

2. The synchronous memory device of claim 1 further comprising:
   a first slew rate circuit connected to the pullup output transistor for controlling a gate signal of the pullup output transistor; and
   a second slew rate circuit connected to the pulldown output transistor for controlling a gate signal of the pulldown output transistor.

3. A method of adjusting an output signal on a data bus line using an integrated circuit driver, the drive comprising a push-pull output circuit, a first adjustable circuit for providing a resistance between the push-pull output circuit and a first reference voltage, and a second adjustable circuit for providing a resistance between the push-pull output circuit and a second reference voltage, the method comprising the steps of:
   connecting the integrated circuit driver to the data bus line;
   generating a first output signal on the data bus line using the driver circuit;
   comparing the output signal on the data bus line with a known voltage level and producing a control signal; and
   selectively activating the first and second adjustable circuits in response to the control signal.

4. The method of claim 3 further comprising the step of selectively activating a slew rate control circuit to reduce signal ringing on the data bus line.

5. The synchronous memory device of claim 1, further comprising:
   output control circuitry connected to the first and second adjustable circuits for controlling signals provided on gate connections of the first and second plurality of transistors.

* * * * *

UNITED STATES PATENT AND TRADEMARK OFFICE
CERTIFICATE OF CORRECTION

PATENT NO. : 6,437,600 B1
DATED : August 20, 2002
INVENTOR(S) : Brent Keeth

It is certified that error appears in the above-identified patent and that said Letters Patent is hereby corrected as shown below:

Title page,
Item [56], FOREIGN PATENT DOCUMENTS, reads "EP 0 655 741 A2  5/1993" should read -- EP 0 655 741 A2  5/1995 --
OTHER PUBLICATIONS, reads "459-468, (1995)." should read -- 459-468 (1995). --
"the United Stated," should read -- the United States, --
"625-629, (1993)." should read -- 625-629 (1993). --
Item [57], ABSTRACT,
Line 8, reads "describe which are coupled ot the pullup and pulldown" should read -- described which are coupled to the pullup and pulldown --

Column 4,
Line 36, reads "intended to limited" should read -- intended to limit --
Line 57, reads "signal provide on the" should read -- signal provided on the --

Column 6,
Line 66, reads "gates 314($a$)14" should read -- gates 314($a$)-($c$) --

Column 7,
Lines 3 and 21, reads "332($a$)-($c$) are" should read -- 340($a$)-($c$) are --
Lines 4 and 22, reads "3440($a$)-($c$) are" should read -- 344($a$)-($c$) are --
Line 28, reads "swing that signal A" should read -- swing than signal A --
Line 59, reads "describe which are coupled" should read -- described which are coupled --

Signed and Sealed this

Eighteenth Day of March, 2003

JAMES E. ROGAN
*Director of the United States Patent and Trademark Office*